(12) United States Patent
Heikenfeld et al.

(10) Patent No.: US 9,113,559 B2
(45) Date of Patent: Aug. 18, 2015

(54) PRESSURE RECONFIGURED ELECTROMAGNETIC DEVICES

(71) Applicants: Jason C. Heikenfeld, Cincinnati, OH (US); Brad L. Cumby, Cincinnati, OH (US)

(72) Inventors: Jason C. Heikenfeld, Cincinnati, OH (US); Brad L. Cumby, Cincinnati, OH (US)

(73) Assignee: University of Cincinnati, Cincinnati, OH (US)

( * ) Notice: Subject to any disclaimer, the term of this patent is extended or adjusted under 35 U.S.C. 154(b) by 245 days.

(21) Appl. No.: 13/971,344

(22) Filed: Aug. 20, 2013

(65) Prior Publication Data

US 2014/0054067 A1 Feb. 27, 2014

Related U.S. Application Data

(60) Provisional application No. 61/691,436, filed on Aug. 21, 2012.

(51) Int. Cl.

| | |
|---|---|
| *H05K 1/02* | (2006.01) |
| *H01Q 15/00* | (2006.01) |
| *H01Q 1/36* | (2006.01) |
| *H01Q 3/01* | (2006.01) |
| *H01Q 9/14* | (2006.01) |
| *H01Q 15/14* | (2006.01) |
| *H01Q 15/24* | (2006.01) |
| *G02B 26/00* | (2006.01) |
| *G02F 1/00* | (2006.01) |
| *H05K 3/10* | (2006.01) |

(52) U.S. Cl.
CPC ............ *H05K 1/0286* (2013.01); *G02B 26/004* (2013.01); *H01Q 1/364* (2013.01); *H01Q 3/01* (2013.01); *H01Q 9/145* (2013.01); *H01Q 15/0066* (2013.01); *H01Q 15/148* (2013.01); *H01Q 15/24* (2013.01); *G02F 1/00* (2013.01); *H05K 3/107* (2013.01); *H05K 2201/10053* (2013.01); *H05K 2203/0278* (2013.01); *H05K 2203/128* (2013.01)

(58) Field of Classification Search
CPC .................. H05K 1/0286; H05K 2201/10053; H05K 3/107; H01Q 15/0066; H01Q 15/148; G02B 26/004
USPC .......................... 174/250, 255, 256, 257, 258
See application file for complete search history.

(56) References Cited

U.S. PATENT DOCUMENTS

| | | | | |
|---|---|---|---|---|
| 8,279,166 | B2 * | 10/2012 | Huitema et al. | 345/107 |
| 2010/0208328 | A1 * | 8/2010 | Heikenfeld et al. | 359/290 |
| 2011/0007056 | A1 * | 1/2011 | Huitema | 345/211 |
| 2011/0194165 | A1 * | 8/2011 | Tsai et al. | 359/228 |
| 2012/0081777 | A1 * | 4/2012 | Heikenfeld et al. | 359/290 |
| 2013/0128336 | A1 * | 5/2013 | Dean et al. | 359/290 |
| 2013/0335805 | A1 * | 12/2013 | Dean et al. | 359/290 |

* cited by examiner

*Primary Examiner* — Timothy Thompson
*Assistant Examiner* — Amol Patel
(74) *Attorney, Agent, or Firm* — Wood, Herron & Evans, LLP

(57) ABSTRACT

A reconfigurable electromagnetic device includes a first and second planar layer having facing surfaces. One of the surfaces includes one or more micro-trenches. The area between the two surfaces is filled with an electro-fluid, such as a liquid metal and a second immiscible fluid, such as an inert gas. When pressure is applied, forcing the two surfaces together, Laplace pressure causes the electro-fluid to flow into the trench as the inert fluid is evacuated from the area between the two surfaces, forming an electromagnetic device. The shape of the trenches defines the reconfigurable device, such as circuitry, switch, antenna or the like. When the inert fluid is reintroduced into the area between the two surfaces, the electro-fluid withdraws from the trench, which is the off position, in which the device does not function.

25 Claims, 5 Drawing Sheets

US 9,113,559 B2

PRESSURE RECONFIGURED ELECTROMAGNETIC DEVICES

RELATED APPLICATION

The present application claims priority to U.S. Ser. No. 61/691,436 filed Aug. 21, 2012, the disclosure of which is hereby incorporated herein by reference in its entirety.

STATEMENT REGARDING FEDERALLY SPONSORED RESEARCH OR DEVELOPMENT

The present invention was made, at least in part, with support from the U.S. Government and funds identified as SAPGrant No. UES-P875-6, awarded by the U.S. Air Force Research Labs. The U.S. Government has certain rights in the present invention.

BACKGROUND OF THE INVENTION

"Reconfigurable electronics" covers a wide variety of technologies, ranging from field-programmable gate arrays to radio-frequency micro-electro-mechanical systems. Conventional approaches use electronic switches to dynamically alter the interconnections between a static layout of electrical wires. Dynamically reconfiguring electrical wiring would be of significant value for simple electronic switches, tunable antennas, adaptive microwave reflectivity, and switchable metamaterials, to name a few applications. For example, reconfiguring antenna circuits can dramatically change the resonant wavelength, as commercially proven with mechanical switches, transistors, or diodes. However, many of these prior approaches switch slowly, require bulky external control systems, and cannot reconfigure the actual wires comprising the circuit.

SUMMARY OF THE INVENTION

The present invention is premised upon the realization that reconfigurable circuits can be formed, utilizing an electro-fluid, i.e. a liquid conductor or semiconductor, such as a liquid metal which is, in turn, manipulated by Laplace and vacuum pressures. Laplace pressures are used to drive the liquid conductors or semiconductors into micro-trenches utilizing a resultant differential pressure induced by a mechanism such as vacuum pressure or mechanical pressure. Upon release of the force, the liquid dewets into droplets that are compacted to 10 to 100 times less area than when in the trenches.

The reconfigurable circuits can be used in a wide variety of different applications, such as erasable electrical networks, switchable antennas, electronic switches, tunable antennas, adaptive reflectors and switchable metamaterials.

The objects and advantages of the present invention we further appreciate in light of the following detailed descriptions and drawings in which:

DETAILED DESCRIPTION OF THE INVENTION

The present invention provides a reconfigurable electronic structure. A reconfigurable electronic structure covers a wide variety of different apparatuses, including reconfigurable electrical wiring, reconfigurable antennas, switches, microwave reflectors, switchable metamaterials, basically anything that uses a defined configuration of a conductor, semiconductor or other material with useful electromagnetic properties. These structures will all incorporate an electro-fluid such as a liquid conductor or semiconductor, which can easily flow into and out of a series of micro-trenches.

Figure 1A:
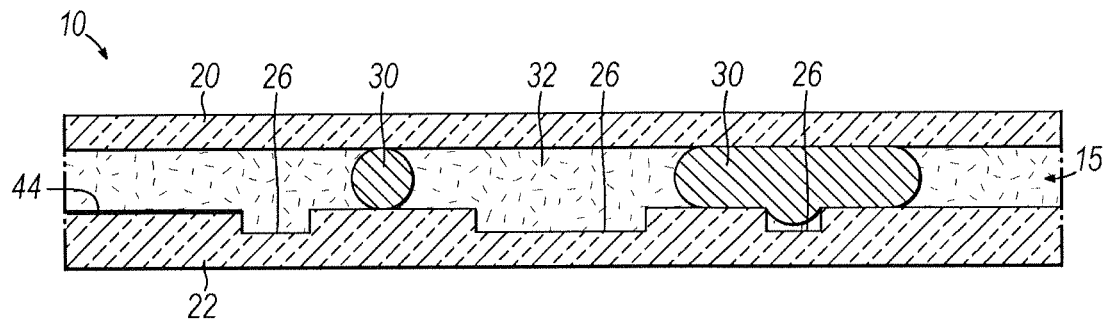
FIGS. 1A-1C are cross-sectional, diagrammatic views of reconfigurable circuits according to the present invention.
Figure 1B:
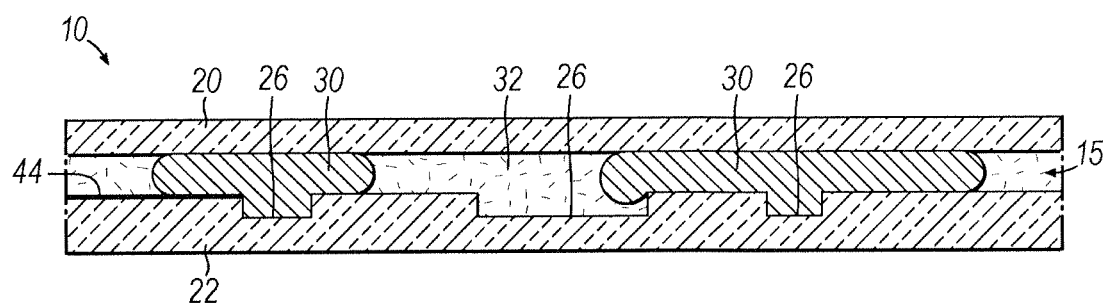
Figure 1C:
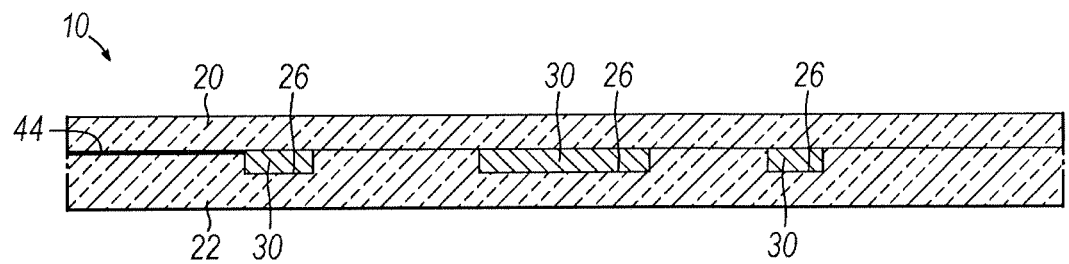

An exemplary reconfigurable electromagnetic device is shown in FIGS. 1A-1C. A reconfigurable electromagnetic device 10 includes a planar substrate 20 and a textured substrate 22 which together form a fluidic cavity 15 holding an electro-fluid 30 and immiscible fluid 32. The planar substrate 20 may be flexible, but is not so limited. The textured substrate 22 is geometrically patterned with defined trenches 26. The trenches 26 define the wiring configuration. The trenches 26 can be the desired shape of an antenna, a circuit or any shape desired. Typically (but not always), the trenches contact one or more permanent conductors (not shown), forming a component of a larger apparatus or circuit. The peripheral edges (not shown) of device 10 are typically sealed and may be connected to a vacuum source as described below.

The electro-fluids suitable for use in the present invention include liquid conductors, dielectric fluids, ferrofluids, fluids with visual or infrared colorization or other liquids or fluids that can alter some interaction with external electromagnetic radiation. Typically for use in the present invention, liquid metals having a very high surface tension can be utilized, such as mercury, gallium indium alloy or gallium indium tin alloy. Aqueous solutions of conductive material, such as sodium chloride can be utilized if the remaining structure is hydrophobic or in a hydrophobic environment. The immiscible fluid 32 will generally be a gas which does not react with electro-fluid 30. Generally an inert gas such as nitrogen is used. With certain electro-fluids, it may be preferable to have a reducing environment to prevent oxidation.

Substrates 20 and 22 can be the same or different materials and must be inert to the electro-fluid 30 and an immiscible fluid 32. These materials can be, for example, polymers such as polyamides, nylons, polyesters such as polyethylene terephthalate, polyvinyl chloride, polyolefins and the like, further they can be other inert and non-conducting materials such as glass. The thickness of the material must be thick enough that it can apply pressure to the electro-fluid without deforming. The upper thickness is a matter of product design. Generally, the substrate will have a thickness no greater than 0.5 inches, generally less than 0.25 inches and generally less than a millimeter.

The device 10 of the present invention can be fabricated in a number of different manners. Initially, the trenches or depressions are formed on a generally planar surface. These trenches can take any desired configuration and can also simply be a plurality of depressions which are not interconnected. The trenches can be formed by embossing the surface of a thermoplastic material with heat. Alternately, a planar surface can be coated with a polymeric film and the trenches formed by ablating portions of the polymeric film using, for example, a $CO_2$ laser. If the substrate is glass, standard etching techniques can be employed. Further methods employed to form vias in semiconductors can also be utilized in the present invention.

The trenches 26 can be formed in multiple layers by, for example, first etching a glass surface, applying a polymeric film over the etched glass and then subsequently forming trenches through the polymeric film. Alternately, the trenches can be formed on surfaces of both substrates 20 and 22. The trenches will generally have a height and width of 10 to 500 microns. The smaller the dimension, the more pressure required to fill the trenches. Likewise, electro-fluids with higher surface tensions require application of greater pressure. In some cases, where extremely high pressures can be applied using piezo-electric actuation or other high pressure means, and/or in cases where the surface tension of the electrofluids can be appropriately reduced, the trenches can have geometries in the nm range.

Figure 7:
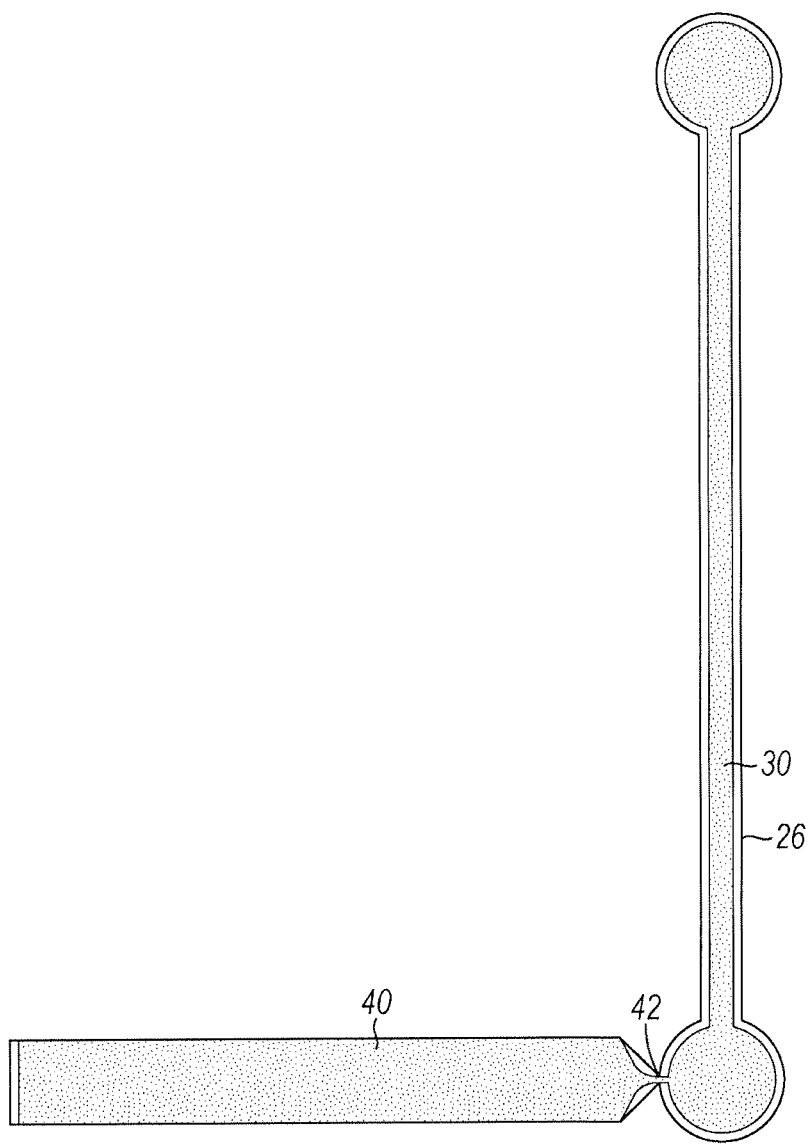
FIG. 7 is a diagrammatic depiction of a dosing apparatus for use in the present invention.

Once the trenches are formed, the two substrates 20 and 22 are placed together and the electro-fluid 30 and inert environment or non-immiscible fluid 32 are introduced in between the two. The electro-fluid maintains the spacing between the two substrates. Proper dosing is important. In one example of electro-fluid dosing, the layers 20 and 22 are placed on top of each other with a dosing reservoir 40 in contact with the trenches 26, as shown in FIG. 7. The edges of the device are sealed and a vacuum applied between the two layers. The vacuum will draw in the liquid from the reservoir 40, which is connected to the trenches 26 at a pinch-point 42, which is a constriction, perhaps 1/10 the diameter of the trenches 26. Application of the vacuum will draw liquid from the reservoir into the device and, when the vacuum is released, the liquid will split at the pinch-point, so that a precise dosage is delivered.

Some, but not all of the devices, will require an electrical connection to another electrical circuit. One or more electrical connections 44 is formed on one of the surfaces of the substrates 20 and 22. In FIGS. 1A-1C, a connection 44 is shown on substrate 22. To allow for an electrical connection that does not alloy with the liquid metal, a carbon screen ink can be used and these inks can then be applied anywhere on the surface of layers 20 and 22 at a position where it will contact one of the trenches and thus the liquid metal.

The device 10 is switched from the off position of FIG. 1A to the on position of FIG. 1C by application of pressure, forcing layers 20 and 22 together. One way to apply pressure is evacuating immiscible fluid 32. As shown in FIGS. 1B and 1C, as the immiscible fluid 32 is evacuated from between the substrates 20 and 22 using a simple pump or vacuum apparatus, and external atmospheric, or other external pressure, substrates 20 and 22 come into closer proximity. As the substrates 20 and 22 come into closer proximity, the electromagnetic fluid 30, which has a contact angle of >90 degrees (non-wetting) with respect to the substrate surfaces is compressed into a non-spherical geometry (see FIG. 1B). A contact angle of >90 creates a fluid meniscus that is convex at unconfined portions of the meniscus, and alternate contact angles are possible with the primary requirement being that the unconfined meniscus is convex (non-wetting). As the space between the substrates 20 and 22 narrows, the electromagnetic fluid 30 experiences an increased Laplace pressure. This increased Laplace pressure causes the electromagnetic fluid 30 to redistribute by fluid flow into spaces between the substrates 20 and 22 that are less confining and therefore imparting of a lower Laplace pressure. Thus, the fluid 30 fills trenches 26 forming, for example, a circuit. As a result of reversible actuation of the substrates 20 and 22 between the states of FIG. 1A through FIG. 1C, the shape of the electromagnetic fluid 30 is changed very rapidly.

Atmospheric pressure is simply one way to cause substrates 20 and 22 to compress together, Simple physical pressure can be applied, such as pressing a button. If higher pressures are required, piston action can be employed to apply mechanical pressure. Other types of devices which function using piezoelectric effect will also function. Any way that pressure can be applied, forcing the substrates 20 and 22 together without irreversibly damaging the functioning of the device, can be employed to cause a change from the on position shown in FIG. 1A to the off position shown in FIG. 1C.

An alternative embodiment of the present invention 11, as shown in FIG. 2, incorporates a microporous film 33 having a series of pores 34, which allows for flow of the immiscible fluid 32, but are too narrow to permit flow of the electro-fluid 30. In this embodiment, the microporous film rests on a porous film 35, such as a textile which allows flow of the immiscible fluid 32 which, in turn, would be connected to a source of vacuum (not shown). The porous film 35 is located between the microporous film 33 and a second rigid material 36, similar in function to layer 20 in FIG. 1A.

Further, in this embodiment, the upper layer 37 includes the trenches 26. Further as shown in this embodiment, the trenches 26, having multiple depths as shown in the activated state in FIG. 2B, the electro-fluid 30 fills the deeper portions of the trench 26 with the more confined, narrower portion 38 having the immiscible fluid 32.

FIGS. 3-6 show exemplary devices of the present invention. As shown in FIGS. 3A-C, a switchable dipole antenna device 12 using a liquid metal for the electromagnetic fluid 30 is formed. These figures are top side views which would have a cross-sectional view similar to that depicted in FIGS. 1A-C. In the topside view, locations of cavities that are less confining are depicted as channels or cavities 50. The unevacuated state (off) of FIG. 3A can be switched by vacuuming to that of FIG. 3B and FIG. 3C, again, with greater levels of evacuation or vacuuming forcing electromagnetic fluid 30 into more tightly confined geometries for electromagnetic fluid 30. Therefore no-antenna FIG. 3A can be reconfigured into a dipole antenna FIG. 3C or intermediate antenna tuning states achieved as well such as FIG. 3B.

Figure 4A:
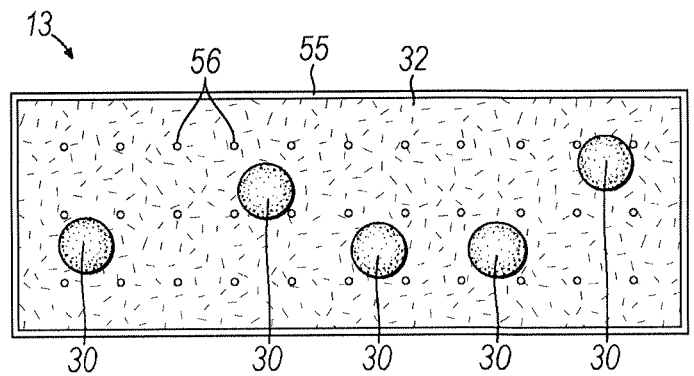
FIGS. 4A and 4B are overhead diagrammatic depictions similar to FIGS. 1A-1C of a microwave shield with the top layer 20 removed as further explained in example 6.
Figure 4B:
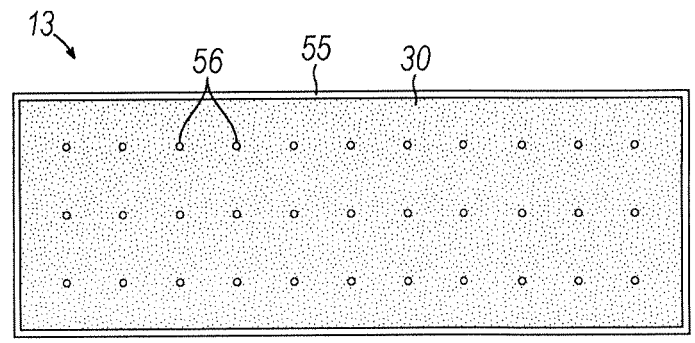

FIGS. 4A and B show a switchable optical or microwave reflector device 13 which is in an actuated state in FIG. 4B. In the non-actuated (off) state of FIG. 4A is optically or electromagnetically transmissive. The actuated cavity in FIG. 4B is uniform in all dimensions, requiring that the substrates (not shown) be adequately rigid to support a uniformly spaced cavity, or requiring small spacer features that regulate the cavity height (also not shown). Making an efficient reflector even with spacers is possible by using metallic spacers (not shown) but even non-metallic spacers are adequate if they are of sizes small enough to not allow electromagnetic transmission at the wavelength of interest (e.g. consider the metallic mesh covering the viewing wind of a microwave oven appliance).

Figure 5A:
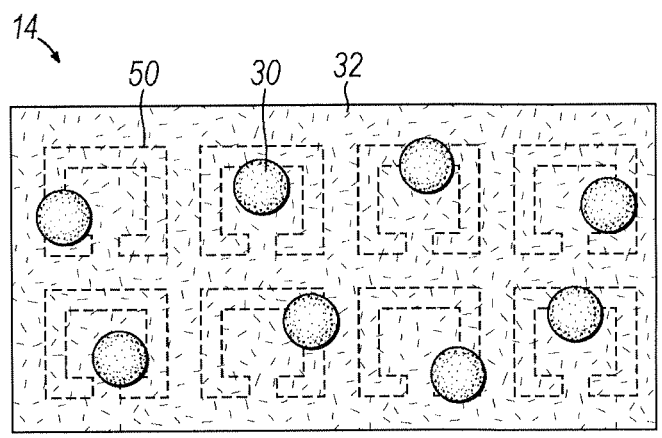
FIGS. 5A and 5B are overhead diagrammatic depictions of a resonator, and as further described in example 5.

With reference to FIG. 5, a switchable metamaterial device 14 is constructed. The device 14 includes numerous arrayed and identical cavities 50. In the device 14 shown, in the non-actuated state of FIG. 5A, the cavities are fluidically connected within a common space between the substrates.

When the substrates 20 and 22 are compressed, the electro-fluid fills trenches 50, forming a plurality of resonators.

Figure 6A:
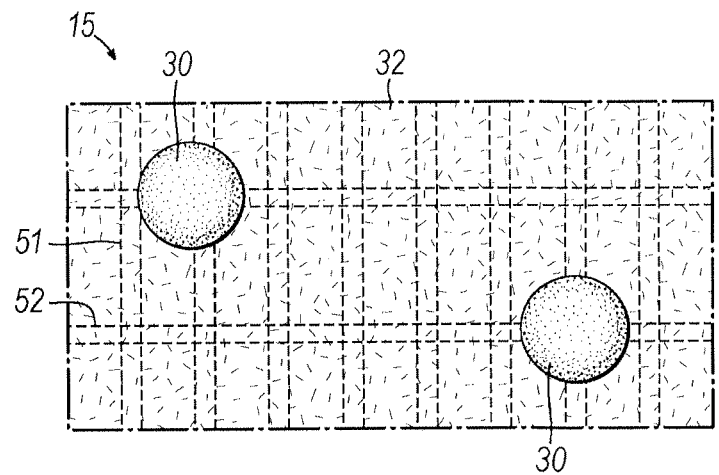
FIGS. 6A and 6B are overhead diagrammatic depictions of the present invention used as a polarizer.
Figure 6B:
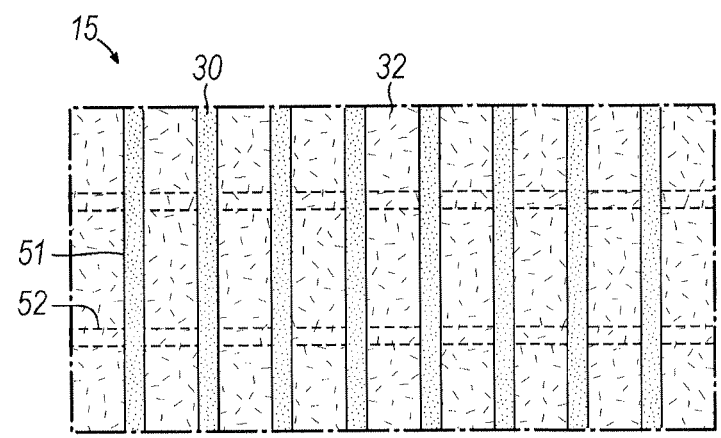

FIGS. 6A and B represent a switchable optical polarizer device 15 which is actuated by switching the liquid metal electromagnetic fluid 30 between circular shapes or drops in FIG. 6A (non-optically polarizing) and a wire polarizer geometry shown in FIG. 6B. The device includes two general types of cavities: cavity 51 which is least confining of all cavities and cavity 52 which is more confining than cavity 51. The purpose of more confining cavity 52 is as follows. If a portion of the electromagnetic fluid 30 is of a volume greater than which one or more cavities 51 can provide volume to fill, then the electromagnetic fluid 30 may flow through more confining cavities 52 and therefore more equally or efficiently distribute the electromagnetic fluid 30 through more least confining cavities 51.

With further reference to FIGS. 1-6, it should be noted, that one or both of the substrates 20 and 22 may contain a geometrically textured surface. In addition, one or more additional porous films or geometrically patterned films or features may be included between substrates 20 and 22 resulting in additional pathways or locations for fluid movement, so long as they move according the pressure actuation and Laplace pressure driven aspects of the present invention. For example, in an alternate embodiment, there could be two or more layers of cavities, separated by films with pores adequate for transport of all fluids, each layer with a unique geometry or set of cavities and fluid actuated between each layer to result in two or more achievable geometrical changes in fluids. This would have a similar effect to stacking of the functionality of the devices in FIGS. 1-6, but only requiring two external substrates 20 and 22.

With further reference to FIGS. 1-6, the electromagnetic fluids chosen and the sizes of cavities or geometry of cavities can vary substantially based on application. For example, creating an optical polarizer for visible light would require very small nanometer scale cavities that are extremely confining and therefore creating very large Laplace pressures, and therefore pressures of evacuation that for a conventional liquid metal could not be achieved by evacuating in earth's atmosphere. Therefore, higher external actuation pressures might be achieved through techniques such as piezoelectric or electrostatic. Any type or origin of actuation pressure used to actuate the fluids may be included with one or more embodiments of the present invention. In addition, actuation pressures can be altered or refined by use of surfactants or changing the wetting angles of the fluids on the substrates or coatings carried by the substrates. In some applications, such as actuating a liquid metal to complete a simple electrically conductive circuit, finger tip pressure applied externally might suffice. The fluids chosen may also vary widely, including liquid metals, ferrofluids, other electrically conductive fluids, dielectric fluids, fluids comprising dispersions or complex fluids comprising two or more phases, etc. The key requirement for the present invention is that the fluids alter some sort of electromagnetic interaction or effect with or within the device as it is actuated. Furthermore, the immiscible fluid and electromagnetic fluids can be interchanged in wetting, or electromagnetic properties. Furthermore, the devices of the present invention can include numerous other features such as electronics, circuits, waveguides, optical films, coatings, geometries, etc., with the only requirement being that reconfiguration of the fluids has a coupled electromagnetic effect with the additional features such that the overall device achieves a switchable or tunable electromagnetic effect. Such effects include but are not limited to changing of electrically capacitive coupling, magnetic coupling, transmission, reflection, attenuation, diffraction, refraction, etc. These would all be reconfigurable electromagnetic devices.

In an alternate embodiment, numerous devices 10 or devices 11 could be arrayed, each with one or more cavity 50, and not fluidically connected or only partially fluidically connected to achieve the same effect of a switchable array of electromagnetic components such as the electromagnetic resonator geometry associated with each cavity 50. Alternately, individual devices in an array could be independently actuated with pressure. Alternately, arrays of cavities in a single device could be simultaneously actuated but not simultaneously responsive by having two or more cavities that are of different levels of confinement for the electromagnetic fluid 30.

With further reference to FIGS. 1-6, in addition, fluids other than electro-fluid can have widely varying interactions with other stimuli, such as thermal, mechanical, or other properties, such that the imparted effects extend beyond simply electromagnetic effects. For example, the proper choice of fluids, the principles of the present invention are readily extendable to devices that could switchably steer, reflect or attenuate ultrasound waves. For example a diffraction grating could be fabricated using a saline mixture resulting in a spacing of $d\sim 150\,um$ ($d*\sin\theta=m*\lambda$, 90 degrees, $v=1560$ m/s, $f=10$ Mhz, $m=1$) if it were to be used with bio applications (2-18 MHz, sonography). Or if the saline is to be used as a switchable coupling agent (impedance match in on state) and attenuating (mismatch, in off state) similar to that of the water based gel used in medical sonography or ultrasonic mixing (mixes in only coupled areas).

The invention can be further appreciated in light of the following examples:

EXAMPLE 1

Figure 2A:
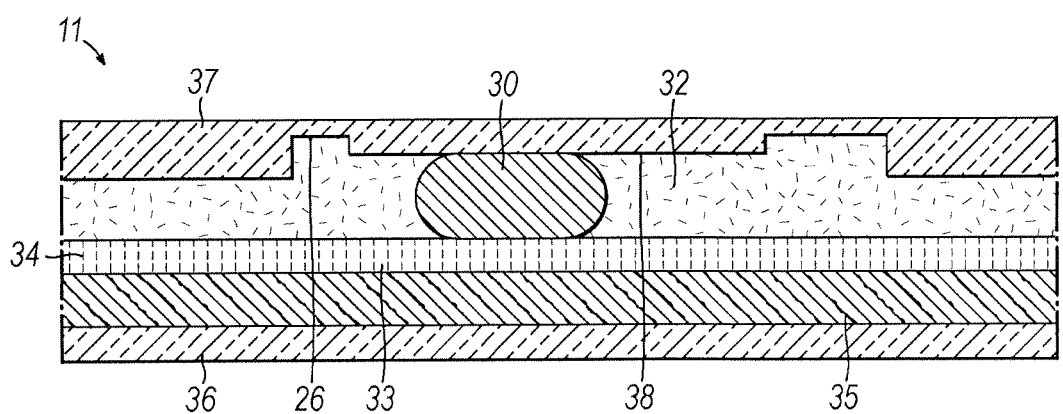
FIGS. 2A and 2B are cross-sectional views of an alternative embodiment of the present invention.
Figure 2B:
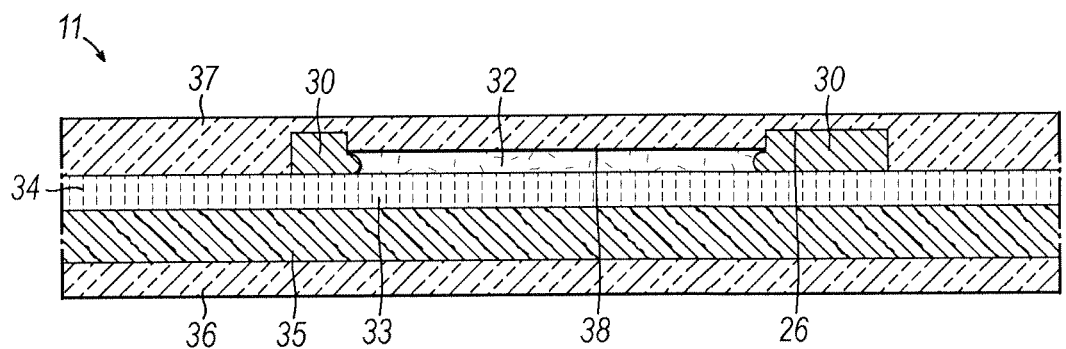

The device depicted in FIGS. 1A-1C was formed. It includes microreplicated channels 26 of 0.050 mm in thickness and various widths (0.050-1.0 mm) fabricated using a glass substrate and lamination of a negative-acting photoresist (DuPont PerMx). The substrate is placed onto a vacuum table then liquid metal is dosed onto the substrate a polymer sheet (polyethylene terephthalate) of 0.254 mm in thickness is then placed over top of the liquid metal and substrate. A 254 mm×254 mm sheet of pvc, 0.1 mm in thickness was placed over the entire device as well as the vacuum table stage to ensure a seal. The device as well as the space between the device and pvc layer is placed under vacuum at 9.8 psi and then returned to atmospheric pressure for the actuated and non-actuated states. This process can be repeated but for faster actuation by including a textile and a 0.03 mm thick polyimide track etched membrane with 0.0004 mm diameter vertical pores at a density of $1.5\times10^{18}$ mm$^{-2}$ (AR Brown-US) (as shown in FIGS. 2A and B).

EXAMPLE 2

Figure 3A:
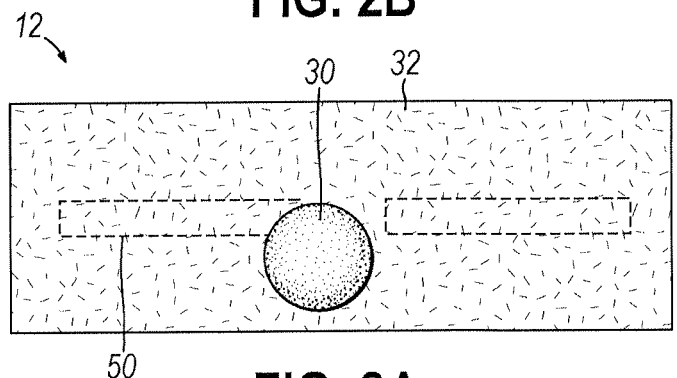
FIGS. 3A-3C are overhead diagrammatic depictions similar to FIGS. 1A-1C of a dipole antenna with the top layer 20 removed and described in example 2.
Figure 3B:
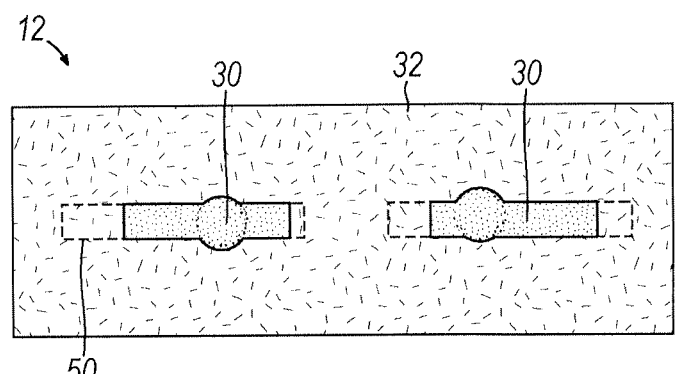
Figure 3C:
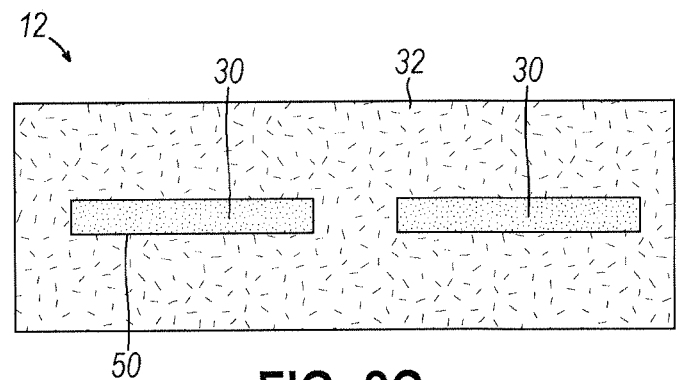

The device depicted in FIGS. 3A-3C is a switchable dipole antenna made according to the following example. Switchable dipole antenna 12 of 52 mm in length and approximately 0.5 mm in width was fabricated by laminating a polyimide tape (Kapton) of 0.15 mm in thickness onto a 0.254 mm polyethylene terephthalate substrate and then ablated using a $CO_2$ laser to form trenches 50. Electrical traces (not shown) were made of silver ink, perpendicular to the dipole arms and extending ~2.0 mm. Two via holes were ablated into another polyethylene terephthalate superstrate. Two copper leads (not shown) were attached to the silver ink traces. Liquid metal 30 and hydrochloric acid vapor 32 were located between the two layers. These leads were then attached to a network analyzer for resonance measurements while the device is in the on (resonant) (FIG. 3C) and off (non-resonant) (FIG. 3A) states. Distinct resonance frequencies were detected in only the on state.

EXAMPLE 3

A variable dipole fabrication. Fabrication of a mold for a pdms superstrate for the variable dipole antenna arm design was made by Makerbot Replicator 2 3D printer. The printed mold consists of two tapered dipole arms (~1.0 mm taper in z direction) and retraction domes ~4.0 mm in diameter. Double sided Kapton tape was cut into strips and placed on the edges of a porous track etched membrane. This allows for ease of realignment or refinement of the liquid metal dosed while still providing a durable seal with the final assembly. The liquid metal is dosed approximately to the size of the retraction domes of the pdms superstrate and placed on the membrane. The pdms and membrane strata are then pressed together forming a seal. A corner of the vacuum pouch is cut and a semi-rigid acid resistant tubing placed through this cut and applying epoxy around the tubing. Finally a textile wipe is inserted under the assembled dipole inside the vacuum pouch and a drop of HCl acid is placed onto the wipe.

EXAMPLE 4

Again following the design shown in FIGS. 1A-1C, wheatstone bridge and voltage divider networks of ~0.3 mm in width were fabricated using glass substrate and lamination of a polyimide tape (Kapton) of 0.025 mm in thickness and then ablation using a $CO_2$ laser. The substrate is placed onto a vacuum table then liquid metal is dosed onto the substrate and a polymer sheet over top of substrate and liquid metal. A 254 mm×254 mm sheet of pvc, 0.1 mm in thickness was placed over the entire device as well as the vacuum table stage to ensure a seal. The device as well as the space between the device and pvc layer is placed under vacuum at 9.8 psi and then returned to atmospheric pressure for the actuated and non-actuated states.

EXAMPLE 5

Figure 5B:
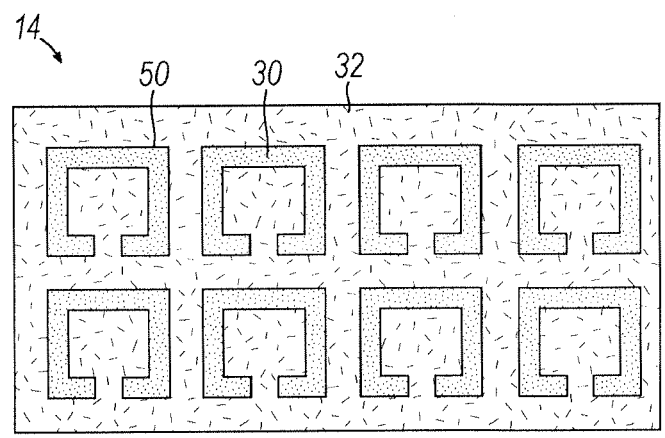

Again following the design of FIGS. 1A-1C and further depicted in FIGS. 5A and 5B, isolated resonators were fabricated using glass substrate and lamination of a polyimide tape (Kapton) of 0.025 mm in thickness and then ablation using a $CO_2$ laser to form trenches 26. Substrate is placed onto a vacuum table then liquid metal 30 is dosed onto the substrate and a polymer sheet (not shown) over top of substrate and liquid metal. A 254 mm×254 mm sheet of pvc, 0.1 mm in thickness was placed over the entire device as well as the vacuum table stage to ensure a seal. The device as well as the space between the device and pvc layer is placed under vacuum at 9.8 psi and then returned to atmospheric pressure for the actuated (FIG. 5B) and non-actuated states (FIG. 5A).

EXAMPLE 6

As shown in FIGS. 4A and 4B, a variable microwave shield was formed. This was similar to the structure shown in FIGS. 2A and B using a microporous substrate. A polyethylene terephthalate of 0.254 mm in thickness with adhered double sided 0.05 mm thick Kapton tape was used as a superstrate. The Kapton is ablated using a $CO_2$ laser to form a square border 55 (28.5 mm each length) and circular standoffs 56 (shown only in FIG. 4B) (1.0 mm dia.). A 0.03 mm thick polymer track etched membrane with 0.0004 mm diameter vertical pores at a density of $1.5 \times 10^{18}$ mm$^2$ (AR Brown-US) is cut to the same size as the PET/Kapton layer and used as a substrate. The liquid metal 30 is then dosed onto the substrate and the two strata are pressed and sealed together. As done with the dipole, the shield is placed on top of a textile with a drop of HCl acid and into a vacuum pouch that has a tubing for vacuum access. In the case of the dipole, an electrical connection was needed, however, for the shield all that is needed is a free space waveguide setup. The device was fastened in between a transmitting waveguide and a receiving waveguide. The sample holder was made from acrylic and ablated with a $CO_2$ laser. The holder was placed on one side of the device and together fastened to a receiving waveguide that was connected to a power meter. RF waves were emitted from a waveguide attached to a continuous wave RF generator. The RF waves that transmitted though the shield were measured as the device was evacuated (FIG. 4B) and unevacuated (FIG. 4A). In the evacuated state, the device 13 effectively blocked RF transmission.

EXAMPLE 7

As shown in FIG. 7, single depth dosing was fabricated using a glass superstrate and lamination of a negative tone DuPont PerMx photoresist of 0.05 mm in thickness. Geometries to be dosed in were developed in the photoresist as well as a dosing reservoir with distribution channels and pinch-off points, 3.0 mm, 0.5 mm and 0.05 mm respectively. Liquid metal was dosed into reservoir and then a 254 mm×254 mm sheet of pvc, 0.1 mm in thickness was placed over the geometries. Entire device was then set onto a vacuum table, evacuated the device (9.8 psi), the liquid metal presses into the device through the pinch-off point so that the device is fully dosed. The vacuum is then released and then the liquid will split at the pinch-off point so that a more precise dose is delivered.

Thus, the present invention provides significant versatility to be used in a wide variety of different devices. Further, the devices made according to the present invention have an extremely rapid response time, much quicker than devices that pump fluids. These can be used in a wide variety of different environments and, further, can be manufactured very inexpensively.

This has been a description of the present invention along with a preferred method of practicing the present invention, however the invention itself should only be defined by the appended claims.

What is claimed is:
1. A reconfigurable electromagnetic device comprising:
a first layer having a first surface;
a second layer having a second surface facing said first surface;
said first and second surfaces spaced from each other and defining an area between said surfaces;
said second surface having at least one trench;
said area containing first and second immiscible fluids;
said first immiscible fluid being an electro-fluid;
said area further including an evacuation path for said second fluid;
whereby withdrawing said second fluid from said area causes said first fluid to fill said trench and
whereby reintroducing said second fluid into said area causes said first fluid to withdraw from said trench.

2. The device claimed in claim 1 wherein said first fluid is a liquid metal.

3. The device claimed in claim 2 wherein said liquid metal is selected from the group consisting of mercury, gallium indium alloy and gallium indium tin alloy.

4. The device claimed in claim 1 wherein said trench has a height and a depth, wherein said height and said depth are from 10 microns to 500 microns.

5. The device claimed in claim 1 wherein said evacuation path is attached to a vacuum source.

6. The device claimed in claim 1 wherein said evacuation path is a plurality of micropores through one of said substrates.

7. The device claimed in claim 1 wherein said first fluid is conductive.

8. The device claimed in claim 1 wherein said first fluid is a dielectric.

9. The device claimed in claim 1 wherein said second fluid is an inert gas.

10. The device claimed in claim 1 wherein said second fluid is hydrophobic and said first fluid is aqueous.

11. The device claimed in claim 1 further including means to force said first substrate toward said second substrate.

12. The device claimed in claim 11 wherein said means to force said first surface toward said second surface comprises an electromechanical force.

13. The device claimed in claim 11 wherein said means to force said first substrate toward said second substrate comprises a vacuum.

14. The device claimed in claim 11 wherein said means to force said first substrate toward said second substrate comprises a mechanical force.

15. The device claimed in claim 1 wherein said reconfigurable electronic device is a reconfigurable electronic circuit.

16. The device claimed in claim 1 wherein said reconfigurable electronic device is a reconfigurable antenna.

17. The reconfigurable electronic device claimed in claim 1 wherein said device is an electromagnetic coupling.

18. The device claimed in claim 1 comprising an electromagnetic polarizer.

19. A device with a reconfigurable interaction to stimuli comprising;
one or more fluids with an interaction with the stimuli;
at least one fluid being a non-wetting fluid with a meniscus that is convex at unconfined portions of the meniscus;
the one or more fluids at least partially enclosed between at least two substrates;
one or more cavities existing between the at least two substrates;
a means to apply pressure to bring the at least two substrates into closer proximity while said pressure is maintained;
the two substrates when being brought into close proximity causing a reconfiguration of Laplace pressures of the non-wetting fluids;
the reconfiguration of the Laplace pressure of the non-wetting fluids causing a geometrical change in the non-wetting fluid;
the geometrical change in the non-wetting fluid causing the device to have a reconfigured interaction with the stimuli.

20. The device claimed in claim 19 wherein said one or more fluid is a liquid metal.

21. The device claimed in claim 20 wherein the stimuli is magnetic.

22. The device claimed in claim 20 wherein the stimuli is electronic.

23. The device claimed in claim 19 wherein the stimuli is sound waves.

24. The device claimed in claim 19 wherein the stimuli is electromagentic waves.

25. The device claimed in claim 19 wherein the stimuli is vibration waves.

* * * * *